(12) United States Patent
Fung et al.

(10) Patent No.: US 7,675,231 B2
(45) Date of Patent: Mar. 9, 2010

(54) LIGHT EMITTING DIODE DISPLAY DEVICE COMPRISING A HIGH TEMPERATURE RESISTANT OVERLAY

(75) Inventors: Elizabeth Ching Ling Fung, Penang (MY); Kee Yean Ng, Penang (MY); Hong Hust Yeoh, Penang (MY)

(73) Assignee: Avago Technologies ECBU IP (Singapore) Pte. Ltd.

( * ) Notice: Subject to any disclaimer, the term of this patent is extended or adjusted under 35 U.S.C. 154(b) by 712 days.

(21) Appl. No.: 10/779,116

(22) Filed: Feb. 13, 2004

(65) Prior Publication Data
US 2005/0179376 A1    Aug. 18, 2005

(51) Int. Cl.
*H01J 1/62* (2006.01)
*H01K 1/32* (2006.01)

(52) U.S. Cl. .................. 313/506; 313/500; 313/502; 313/512; 313/116

(58) Field of Classification Search ........... 313/512, 313/511, 483, 502, 113, 510
See application file for complete search history.

(56) References Cited

U.S. PATENT DOCUMENTS

| | | | | |
|---|---|---|---|---|
| 3,869,637 A | * | 3/1975 | Usui | 313/500 |
| 3,876,900 A | * | 4/1975 | Amatsuka et al. | 313/510 |
| 4,058,750 A | * | 11/1977 | Schoberl | 313/500 |
| 4,146,883 A | * | 3/1979 | Appeldorn et al. | 340/815.44 |
| 4,168,102 A | * | 9/1979 | Chida et al. | 313/11.1 |
| 4,853,593 A | * | 8/1989 | Stein | 313/500 |
| 5,813,753 A | * | 9/1998 | Vriens et al. | 362/293 |
| 6,720,203 B2 | * | 4/2004 | Carcia et al. | 438/99 |
| 6,741,029 B2 | * | 5/2004 | Matsubara et al. | 313/512 |
| 6,876,149 B2 | * | 4/2005 | Miyashita | 313/512 |
| 6,998,776 B2 | * | 2/2006 | Aitken et al. | 313/512 |
| 2005/0001545 A1 | * | 1/2005 | Aitken et al. | 313/512 |

OTHER PUBLICATIONS

Corning product catalogue online (2006).*

* cited by examiner

*Primary Examiner*—Edward J Glick
*Assistant Examiner*—Thomas R Artman

(57) ABSTRACT

A light emitting diode display device includes a substrate having a first conductive portion and a second conductive portion. A light emitting diode die is coupled to the first conductive portion. A wire bond is coupled to the light emitting diode die and coupled to the second conductive portion. An encapsulant encases the light emitting diode die and the wire bond above the substrate. An overlay is above the encapsulant, wherein the overlay has a high glass transition temperature.

13 Claims, 5 Drawing Sheets

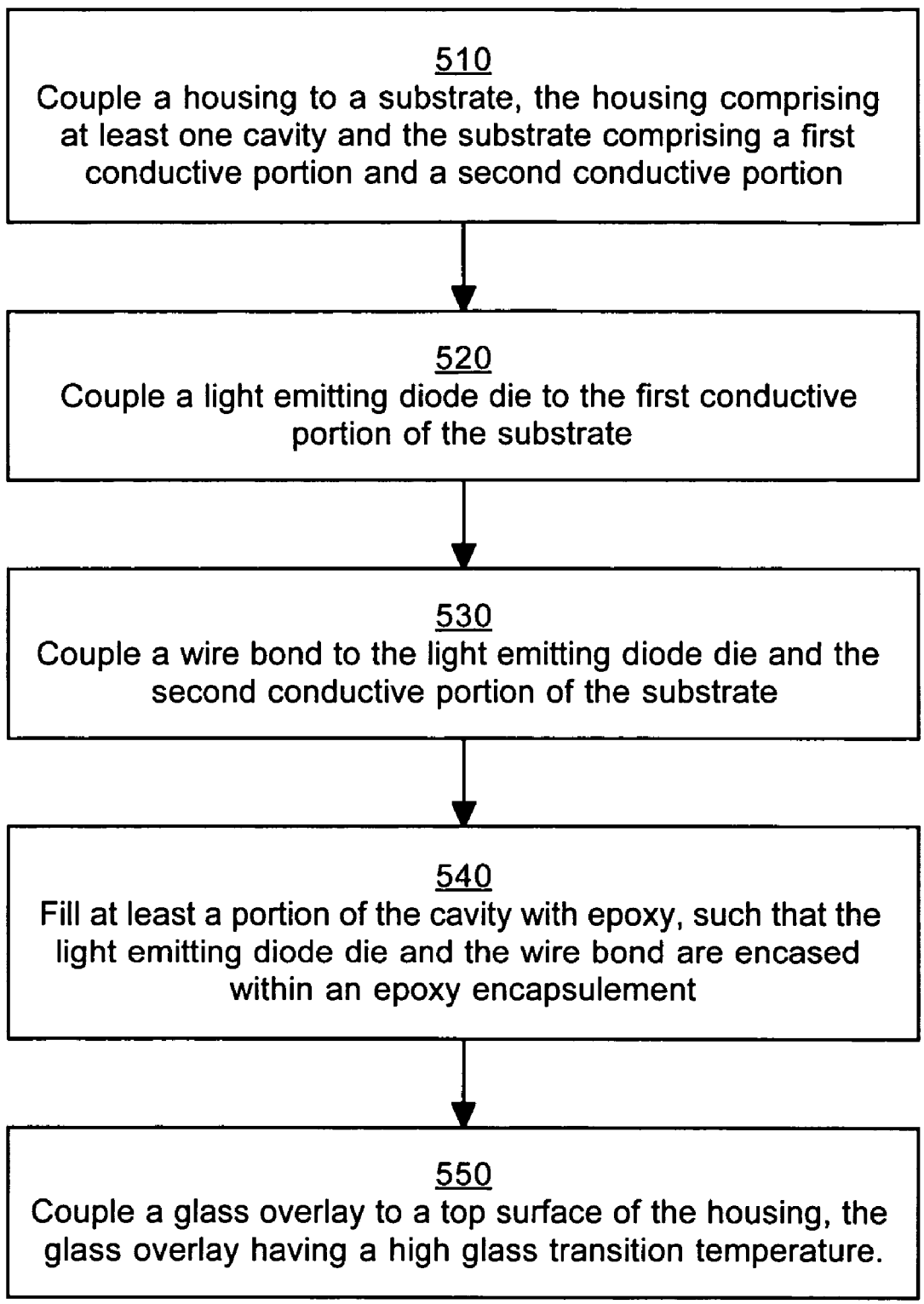

LIGHT EMITTING DIODE DISPLAY DEVICE COMPRISING A HIGH TEMPERATURE RESISTANT OVERLAY

TECHNICAL FIELD

Various embodiments of the present invention relate to the field of light emitting diode display devices.

BACKGROUND

Light emitting diodes (LEDs) emit light when charged with electricity. LEDs provide light in a wide array of electronic devices. Often, LEDs are incorporated into display devices for presenting alphanumeric information or icons. Typically, LEDs are manufactured into an electronic chip (e.g., LED chips) that provide for easy integration into electronic devices. LED display devices may by integrated into electronic devices, such as digital read-out displays, by soldering the leads of an LED display device to a circuit board.

A typical LED display device includes an overlay that is used to present the specific information. An overlay includes a transparent portion that is placed over an LED, such that a lit LED can be seen through the transparent portion. For example, the transparent portion may be in the shape of an icon. Overlays are typically manufactured using plastic, and are typically approximately 0.5 mm in thickness.

As described above, an LED display device is integrated into electronic devices by soldering the LED device to a board using solder paste. Previously, the solder paste used was an alloy including tin and lead. Such solder paste has a melting point of approximately 182 degrees Celsius and is typically reflowed at a temperature of 240 degrees Celsius.

Environmental and health concerns have increased the use of environmental friendly processes in the manufacturing industry. One of the proposed changes is eliminating the use of lead-based products. Currently, solder paste has been changed to remove the lead content. However, lead-free solder paste needs a higher temperature profile during the solder reflow process. Typically, a temperature of at least 260 degrees Celsius is needed. Current display overlays are not able to withstand these higher temperatures, causing the overlay to shrink substantially, resulting in warpage. This shrinkage is unacceptable as it is a major product defect.

SUMMARY

In various embodiments of the present invention, a light emitting diode (LED) display device and a method for generating a light emitting diode display device are described. In one embodiment, a substrate includes a first conductive portion and a second conductive portion. A LED die is coupled to the first conductive portion. A wire bond is coupled to the LED die and coupled to the second conductive portion. An encapsulant encases the LED die and the wire bond above the substrate. An overlay is above the encapsulant, wherein the overlay has a high glass transition temperature.

BRIEF DESCRIPTION OF THE DRAWINGS

The accompanying drawings, which are incorporated in and form a part of this specification, illustrate embodiments of the invention:

FIG. 5 is a flow chart illustrating a process for generating a light emission diode (LED) display device in accordance with an embodiment of the present invention.

The drawings referred to in this description should be understood as not being drawn to scale except if specifically noted.

DETAILED DESCRIPTION

Figure 1:
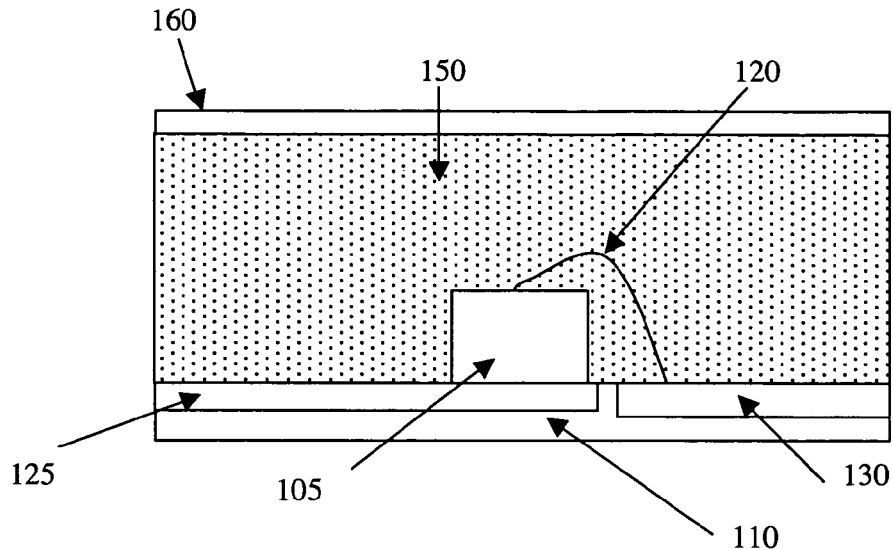
FIG. 1 illustrates a side view of a light emission diode (LED) display device in accordance with an embodiment of the present invention.

FIG. 1 illustrates a side view of an exemplary LED display device 100 in accordance with an embodiment of the present invention. LED display device 100 includes a light emitting diode (LED) die 105, a wire bond 120, and a substrate 110 including a first conductive portion 125 and a second conductive portion 130. LED die 105 is coupled to first conductive portion 125. Wire bond 120 is coupled to LED die 105 and second conductive portion 130. LED 105 and wire bond 120 are encased in an encapsulant 150. An overlay 160 resides over encapsulant 150.

In one embodiment, substrate 110 is a printed circuit board (PCB), wherein first conductive portion 125 and second conductive portion 130 are conductive interconnects of the PCB. In another embodiment, substrate 110 is a lead frame, wherein first conductive portion 125 and second conductive portion 130 are separate conductive segments. It should be appreciated that in the present embodiment, substrate 110 as shown is not necessary, as first conductive portion 125 and second conductive portion 130 are sufficient for supporting LED die 105, wire bond 120, and encapsulant 150. In another embodiment, substrate 110 is a ceramic base substrate. In another embodiment, substrate 110 is a flexible circuit substrate. It should be appreciated that any semiconductor substrate including separate conductive portions can be used in embodiments of the present invention.

LED die 105 is coupled to first conductive portion 125. In one embodiment, a power signal is received at LED die 105 over first conductive portion 125. While embodiments of the invention are described using an LED die, it should be appreciated that other types of light sources may be implemented, such as an infrared emitting diode (IRLED), an ultraviolet emitting device (UVLED), or a laser diode. Additionally, a light receiver such as a photo detector can also be implemented. Wire bond 120 is coupled to LED die 105 and second conductive portion 130. LED die 105 receives positive and negative power signals via first conductive portion 125 and wire bond 120, and emits light in response to such signals. In one embodiment, wire bond 120 is a gold wire. However, it should be appreciated than any conductive material may be implemented at wire bond 120. In one embodiment, first conductive portion 125 operates as a cathode for transmitting a negative power signal, and second conductive portion 130 operates as an anode for transmitting a positive power signal.

Encapsulant 150 is formed over LED 105 and wire bond 120. In the present embodiment, encapsulant 150 is a solid or semi-solid material sufficient for supporting overlay 160, such as an epoxy. In one embodiment, a transfer molding process is used to form epoxy as encapsulant 150. A mold is placed over substrate 110, surrounding LED die 105 and wire bond 120. Epoxy is made to flow over LED die 105 and wire bond 120 into a cavity made by the mold. In one embodiment, encapsulant 150 has substantially half epoxy resin and substantially half epoxy hardener. However, it should be appreciated that any ratio of epoxy resin and epoxy hardener may be used. Encapsulant 150 is translucent or transparent, allowing for the passage of light. In one embodiment, encapsulant 150 includes a color tinting for filtering the wavelength of light passing through encapsulant 150. In one embodiment, encapsulant 150 includes diffusant for diffusing light passing through encapsulant 150.

Overlay 160 resides over encapsulant 150, wherein overlay 160 has a high glass transition temperature ($T_g$). In one embodiment, the glass transition temperature is at least 260 degrees Celsius. In one embodiment, overlay 160 includes glass. Overlay 160 is able to withstand high temperature soldering associated with lead-free solder paste with substantially no noticeable physical changes. Furthermore, the thermal expansion of overlay 160 is very low. Moreover, using glass as overlay 160 provides the additional benefits of high scratch resistance and high moisture resistance, relative to current plastic overlays. While embodiments of the invention are described using a glass overlay, it should be appreciated that other any translucent or transparent material with a high glass transition temperature may be implemented, such as high temperature resistant plastic. In one embodiment, overlay 160 includes a band pass filter for filtering light of a particular wavelength.

Overlay 160 may be attached to encapsulant 150 using a number of different glues or sealants, including but not limited to: an epoxy bond, a high temperature glue, double sided tape, or a glass sealing process. It should be appreciated that a different sealant can be selected depending on engineering constraints. For example, an epoxy bond provides a bond that is highly resistant to moisture. In contrast, double-sided tape may not provide high moisture resistance, but is less costly than an epoxy bond.

Figure 2A:
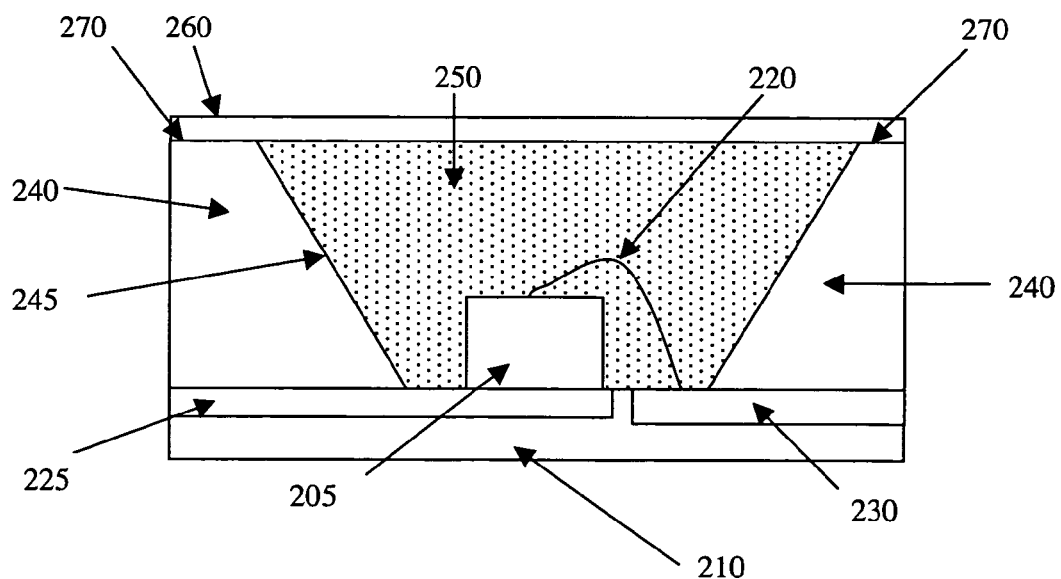
FIG. 2A illustrates a side view of a light emission diode (LED) display device in accordance with another embodiment of the present invention.

FIG. 2A illustrates a side view of an exemplary LED display device 200 in accordance with another embodiment of the present invention. LED display device 200 is similar to LED display device 100 of FIG. 1, except LED display device 200 also includes housing 240. LED display device 200 includes LED die 205, wire bond 220, and a substrate 210 including first conductive portion 225 and second conductive portion 230. LED die 205 is coupled to first conductive portion 225. Wire bond 220 is coupled to LED die 205 and second conductive portion 230. Housing 240 is coupled to substrate 210 and includes cavity 245 into which LED die 205 and wire bond 220 may be placed. The cavity is filled with an encapsulant such that a portion of cavity 245 is filled with encapsulant 250. In one embodiment, the walls of cavity 245 include a reflective surface. LED 205 and wire bond 220 are surrounded by encapsulant 250. Overlay 260 resides over encapsulant 250.

In one embodiment, encapsulant 250 is formed over LED 205 and wire bond 220 in the cavity. In one embodiment, encapsulant 250 is an epoxy. However, other materials and substances, such as silicone, gas or air, can also be implemented as encapsulant 250. It should be appreciated that any organic or inorganic material may be implemented as encapsulant 250, and that encapsulant 250 is not limited to the described embodiments.

In one embodiment, a casting process is used to form an epoxy encapsulant. Epoxy is made to flow into the cavity over LED die 205 and wire bond 220. In one embodiment, the epoxy includes substantially half epoxy resin and substantially half epoxy hardener. However, it should be appreciated that any ratio of epoxy resin and epoxy hardener may be used. Encapsulant 250 is translucent, allowing for the passage of light. In one embodiment, encapsulant 250 includes a color tinting for filtering the wavelength of light passing through encapsulant 250. In one embodiment, encapsulant 250 includes diffusant for diffusing light passing through encapsulant 250.

It should be appreciated that overlay 260 is similar to overlay 160 of FIG. 1. In one embodiment, overlay 260 is attached to housing 240 at surface 270. As described above, overlay 260 may be attached using a number of different glues or sealants, including but not limited to: an epoxy bond, a high temperature glue, double sided tape, or a glass sealing process. It should be appreciated that a different sealant can be selected depending on engineering constraints.

Figure 2B:
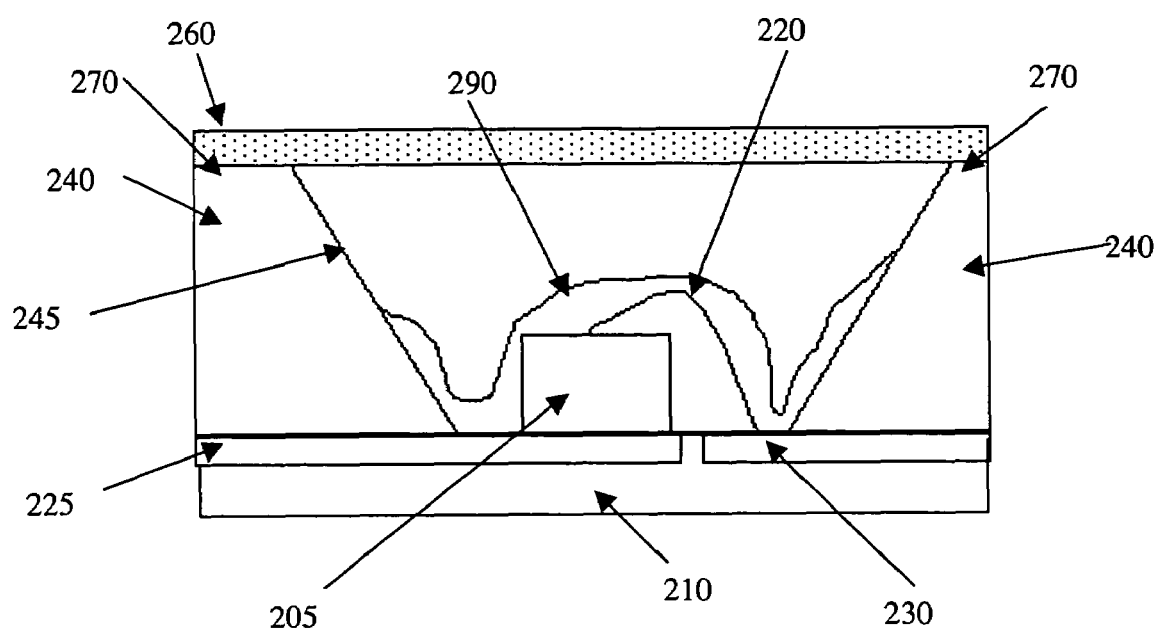
FIG. 2B illustrates a side view of a light emission diode (LED) display device including an encapsulant coating in accordance with another embodiment of the present invention.

FIG. 2B illustrates a side view of LED display device 280 including an encapsulant coating 290 in accordance with another embodiment of the present invention. LED display device 280 is similar to LED display device 200 of FIG. 2A, except LED display device 280 includes an encapsulant coating 290 surrounding LED 205 and wire bond 220. In one embodiment, encapsulant coating 290 is adhered to LED 205 and wire bond 220 by use of a coating process. In one embodiment, encapsulant coating 290 is comprised of an epoxy. However, it should be appreciated that any organic or inorganic material that can coat LED 205 and wire bond 220 may be used. In one embodiment, encapsulant coating 290 also coats a portion of the walls of cavity 245.

Figure 3B:
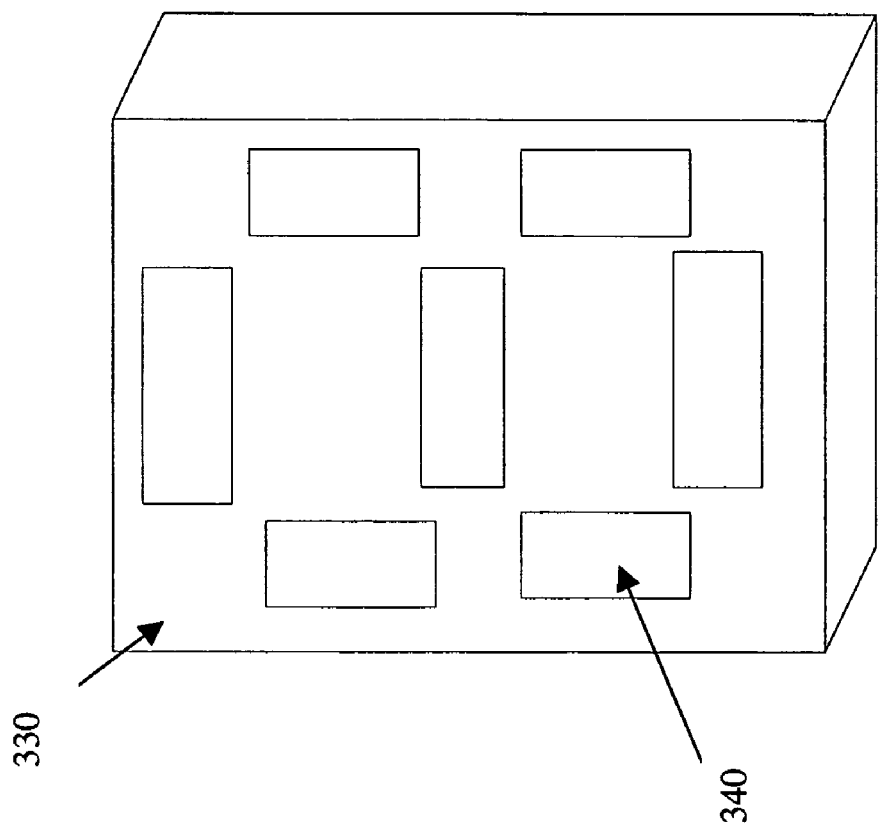
FIG. 3B illustrates an exemplary housing in accordance with an embodiment of the present invention.
Figure 3A:
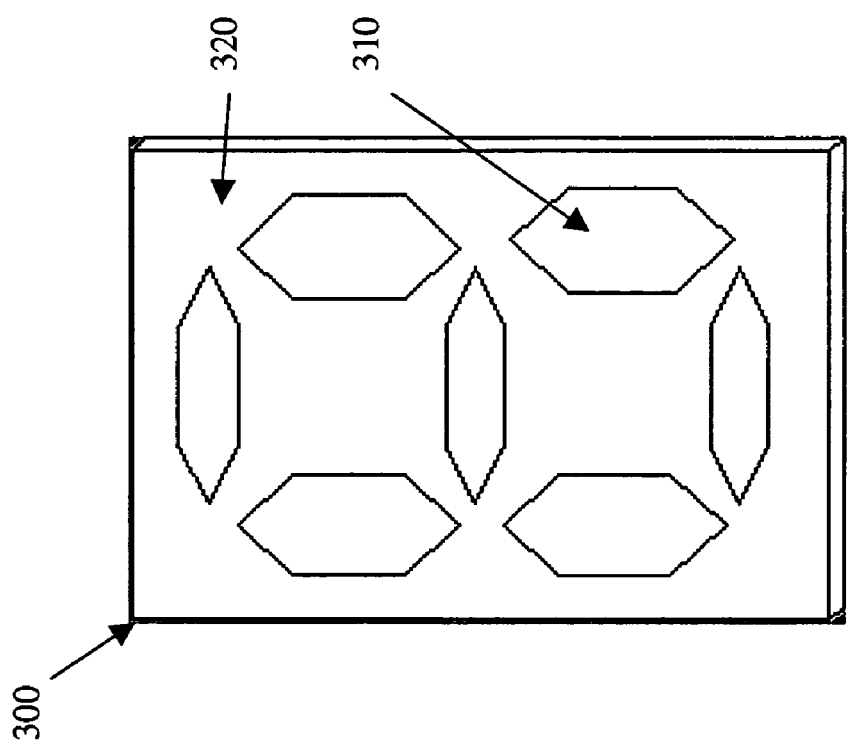
FIG. 3A illustrates an exemplary overlay in accordance with an embodiment of the present invention.

FIG. 3A illustrates an exemplary overlay 300 for a seven segment digital readout in accordance with an embodiment of the present invention. As described above, overlay 300 has a translucent material with a high glass transition temperature, such as glass. In one embodiment, overlay 300 is printed with seven segments. The segments are defined as transparent portions 310 surrounded by opaque portion 320. In other words, the transparent portions 310 open up windows in overlay 300 to the underlying LEDs.

In one embodiment, transparent portions 310 are created by first blocking off portions of overlay 300 with a mask or a stencil. An opaque coating is then applied over the mask or stencil. The mask/stencil is then removed, revealing transparent portions 310 defined by opaque portion 320. It should be appreciated that overlay 300 can include any number of transparent portions 310 and opaque portions 320, and that they can be of any shape or size. Overlay 300 can then be attached to an LED display device or the housing of an LED display device. In one embodiment, overlay 300 is attached with the coating side against the LED display device or housing, to eliminate scratching of the coating.

FIG. 3B illustrates an exemplary housing 330 in accordance with an embodiment of the present invention. Housing 330 (also referred to as a scrambler) includes seven cavities 340 for receiving an LED die, such that housing 300 may provide a seven segment digital readout for displaying alphanumeric information. In one embodiment, housing 300 includes an opaque polycarbonate material. In one embodiment, the opaque polycarbonate material is white. In another embodiment, housing 300 includes a ceramic material. Overlay 300 of FIG. 3A is attached to housing 330 to form a seven segment digital readout. Overlay 300 may be attached using a number of different glues or sealants, including but not limited to: an epoxy bond, a glue that can stand high temperature, double sided tape, or a glass sealing process.

Figure 4A:
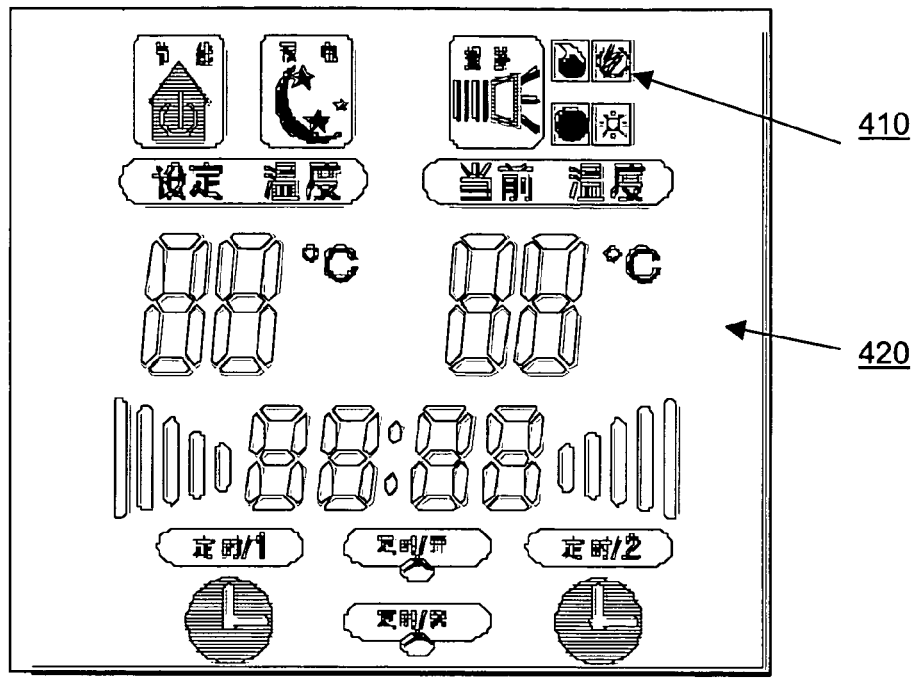
FIG. 4A illustrates an exemplary overlay having multiple icons in accordance with an embodiment of the present invention.

FIG. 4A illustrates an exemplary overlay 400 having multiple icons in accordance with an embodiment of the present invention. Overlay 400 includes a plurality of transparent portions 410 defined by opaque portion 420. Transparent portions 410 define icons and segments for presenting information. It should be appreciated that overlay 400 can include any number of transparent portions 410 and opaque portions 420, and that they can be of any shape or size.

Figure 4B:
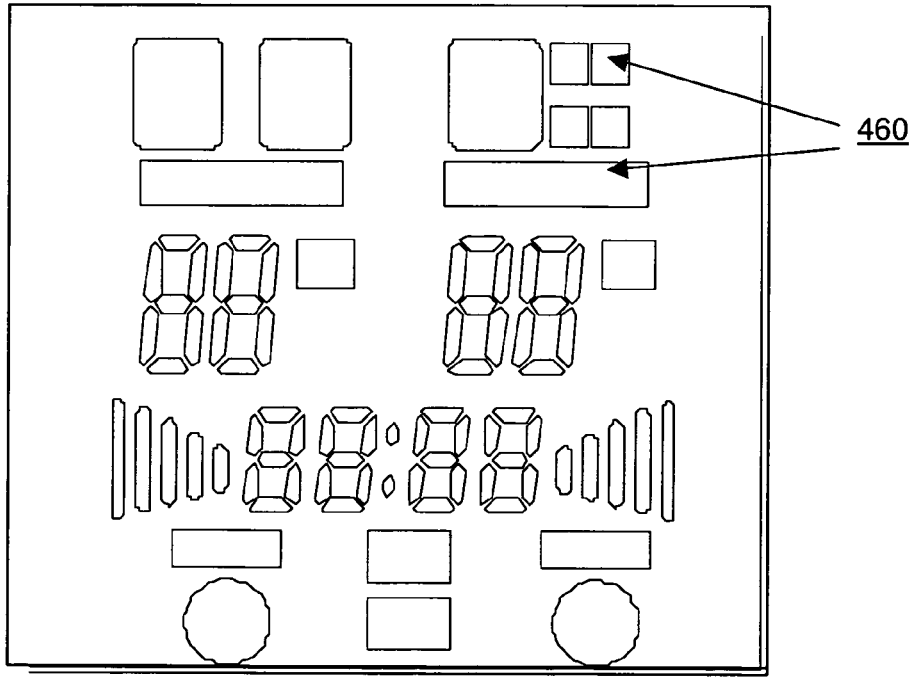
FIG. 4B illustrates an exemplary housing having multiple cavities in accordance with an embodiment of the present invention.

FIG. 4B illustrates an exemplary housing 450 having multiple cavities 460 in accordance with an embodiment of the present invention. The cavities 460 line up with transparent portions 410 of overlay 400. Overlay 400 is attached to housing 450 to form an LED display device for use in electronic devices. As described above, overlay 400 may be attached using a number of different glues or sealants, including but not limited to: an epoxy bond, a high temperature glue, double sided tape, or a glass sealing process.

FIG. 5 is a flow chart illustrating a process 500 for generating an LED display device in accordance with an embodiment of the present invention. For purposes of clarity, the following discussion will refer to FIG. 2A to more clearly describe the present invention. However, it should be appreciated that other embodiments of the present invention may be generated according to process 500. Although specific steps are disclosed in process 500, such steps are exemplary. That is, the embodiments of the present invention are well suited to performing various other steps or variations of the steps recited in FIG. 5.

At step 510 of process 500, housing 240 is coupled to substrate 210. Housing 240 includes at least one cavity. Substrate 210 includes first conductive portion 225 and second conductive portion 230. In one embodiment, housing 240 has seven cavities arranged to provide a seven segment digital readout.

At step 520, LED die 205 is coupled to first conductive portion 225. At step 530, wire bond 220 is coupled to LED die 205 and second conductive portion 230. At step 540, at least a portion of the cavity is filled with epoxy, such that LED die 205 and wire bond 220 are encased within encapsulant 250. In one embodiment, encapsulant 250 is dyed with a color tinting. In one embodiment, encapsulant 250 includes diffusant.

At step 550, overlay 260 is coupled to top surface 270 of housing 240, wherein overlay 260 has a high glass transition temperature. As described above, overlay 260 may be attached using a number of different glues or sealants, including but not limited to: an epoxy bond, a high temperature glue, double sided tape, or a glass sealing process.

Embodiments of the invention provide an LED display device that provides higher resistance to shrinkage caused by a soldering process. Furthermore, embodiments of the present LED display device have improved scratch resistance and improved moisture resistance. The described embodiments provide an LED display device that configured for use with lead-free solder paste.

In accordance with various embodiments of the present invention, a light emitting diode display device, are thus described. While the present invention has been described in particular embodiments, it should be appreciated that the present invention should not be construed as limited by such embodiments, but rather construed according to the below claims.

What is claimed is:

1. A light emitting diode display device, comprising:
    a substrate comprising a first conductive portion and a second conductive portion;
    a light emitting diode die coupled to said first conductive portion;
    a wire bond coupled to said light emitting diode die and coupled to said second conductive portion;
    a non-gaseous encapsulant coating said light emitting diode die and surrounding said wire bond and extending above said substrate such that said light emitting diode die and said wire bond are encapsulated between said substrate and said non-gaseous encapsulant coating;
    an overlay bonded to said light emitting diode display device above said non-gaseous encapsulant coating, said overlay comprising an opaque area and a transparent area, said transparent area and said opaque area both being illuminated by said light emitting diode, while only light from said transparent region leaves said light emitting display device, said overlay having a glass transition temperature of at least 260 degrees Celsius;
    wherein said non-gaseous encapsulant coating comprises a color tinting that filters the light passing through said tinting based on the wavelength of said light.

2. The light emitting diode display device as recited in claim 1 further comprising a housing comprising a cavity, said housing coupled to said substrate such that said encapsulant fills at least a portion of said cavity.

3. The light emitting diode display device as recited in claim 2 wherein said overlay is attached to a top surface of said housing.

4. The light emitting diode display device as recited in claim 1 wherein said overlay comprises glass.

5. The light emitting diode display device as recited in claim 1 wherein said overlay comprises a band pass filter.

6. The light emitting diode display device as recited in claim 1 wherein said substrate comprises at least one of a printed circuit board, a flexible circuit, a ceramic substrate, and a lead frame.

7. A method for generating a light emitting diode display device, said method comprising:
    coupling a housing to a substrate, said housing comprising at least one cavity and said substrate comprising a first conductive portion and a second conductive portion;
    coupling a light emitting diode die to said first conductive portion of said substrate;
    coupling a wire bond to said light emitting diode die and said second conductive portion of said substrate;
    filling at least a portion of said cavity with a non-gaseous encapsulant, such that said light emitting diode die and said wire bond are encased within said non-gaseous encapsulant or between said encapsulant and said substrate;
    coupling an overlay to a top surface of said housing, said overlay comprising an opaque area and a transparent area, said transparent area and said opaque area both being illuminated by said light emitting diode, while only light from said transparent region leaves said light emitting display device, said overlay having a glass transition temperature of at least 260 degrees Celsius;
    wherein said non-gaseous encapsulant comprises a color tinting that filters the light passing through said tinting based on the wavelength of said light.

8. The method as recited in claim 7 wherein said overlay comprises glass.

9. A multiple light emitting diode display device, comprising:
- a substrate;
- a housing coupled to said substrate, said housing comprising a plurality of cavities;
- a plurality of light emitting diode digs coupled to said substrate wherein at least one light emitting diode die of said plurality of light emitting diode dies resides within at least one cavity of said plurality of cavities;
- a non-gaseous encapsulant that together with said substrate surrounds said at least one of said light emitting diode dies within at least one of said cavities; and
- an overlay above a top surface of said housing, said overlay comprising an opaque area and a transparent area, said transparent area and said opaque area both being illuminated by said light emitting diode, while only light from said transparent region leaves said light emitting display device, said overlay having a glass transition temperature of at least 260 degrees Celsius;
- a layer of double-sided tape, said overlay being attached to said top surface by said layer of double-sided tape.

10. The multiple light emitting diode display device as recited in claim 9 wherein said overlay comprises glass.

11. The multiple light emitting diode display device as recited in claim 9 wherein said non-gaseous encapsulant comprises at least one of epoxy or silicone.

12. The multiple light emitting diode display device as recited in claim 9 wherein said non-gaseous encapsulant comprises a color tinting that filters the light passing through said tinting based on the wavelength of said light.

13. The multiple light emitting diode display device as recited in claim 9 wherein said housing comprises seven cavities arranged to provide a seven segment digital readout.

* * * * *